(12) United States Patent
Clara et al.

(10) Patent No.: US 6,989,778 B2
(45) Date of Patent: Jan. 24, 2006

(54) SEMI-CONDUCTOR CIRCUIT ARRANGEMENT

(75) Inventors: Martin Clara, Villach (AT); Antonio Di Giandomenico, Villach (AT); Andreas Wiesbauer, Pörtschach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/938,741

(22) Filed: Sep. 10, 2004

(65) Prior Publication Data
US 2005/0093732 A1    May 5, 2005

(30) Foreign Application Priority Data
Sep. 11, 2003 (DE) .............................. 103 42 057

(51) Int. Cl.
*H03M 3/00* (2006.01)
(52) U.S. Cl. ...................... 341/143; 341/144; 341/154
(58) Field of Classification Search ............... 341/143, 341/144, 145, 154, 200, 126, 136
See application file for complete search history.

(56) References Cited

U.S. PATENT DOCUMENTS 4,316,178 A * 2/1982 Shibayama et al. ......... 341/118
5,070,332 A * 12/1991 Kaller et al. ................ 341/156
6,882,294 B2 * 4/2005 Linder et al. ............... 341/154

OTHER PUBLICATIONS

Moyal et al., "A 700/900mW/Channel CMOS Dual Analog Front-End IC for VDSL with Integrated 11.5/14.5dBm Line Drivers", 2003 IEEE Solid-State Circuits Conference, Digest of Technical Papers, Feb. 12, 2003, (10 pages).
Dörrer et al., "A 10-Bit, 4mW Continuous-Time Sigma-Delta ADC for UMTS in a 0.12 $\mu$m CMOS Process", Proceedings of the 2003 Symposium on Circuits and Systems, ISCAS, May 2003, pp. I-1057 to I-1060 (4 pages).

* cited by examiner

*Primary Examiner*—John B Nguyen
(74) *Attorney, Agent, or Firm*—Maginot, Moore & Beck

(57) ABSTRACT

A semi-conductor circuit arrangement for a continuous time sigma delta modulator for adding analog input signals to a digital fed back signal and for quantizing the totalled signal comprises a voltage to current conversion circuit (10), an adding circuit (20) with a resistor ladder, a quantizing circuit (40) with comparator elements (45) and a digital to analog conversion circuit (30). For each comparator element (45) its respective input signal is formed by a voltage which is released between a tap in front of a corresponding tapping resistor (22) in a first string of the resistor ladder and a tap in front of a corresponding tapping resistor (22) in a second string of the resistor ladder.

20 Claims, 4 Drawing Sheets

SEMI-CONDUCTOR CIRCUIT ARRANGEMENT

BACKGROUND

The present invention relates to a semi-conductor circuit arrangement, in particular a semi-conductor circuit arrangement for use in continuous time sigma delta modulator circuits, e.g. for high-speed broadband transceivers.

Sigma delta modulators operating as continuous-time modulators, so-called continuous time sigma delta modulators (CT-SD modulators), have the advantage of lower power consumption than sigma delta modulators operating as discrete-time modulators, making these components particularly suitable for wireless signal transmission devices. Alternatively, there is the advantage of a higher bandwidth for the signal processing with the same power consumption. Use of CT-SD modulators is therefore of particular advantage in high-speed broadband signal transmission, such as in VDSL-AFE transceivers, for example.

In a CT-SD modulator circuit, as shown in FIG. 3, a digital output signal 2 of the circuit is fed back into an analog input signal 1 via an outer loop 100. For this purpose the signal is converted into an analog signal by means of an external digital to analog converter 30A.

In order to stabilise the CT-SD modulator circuit against too great a loop delay, an additional inner loop 200 is added, which feeds back the digital output signal 2 of the CT-SD modulator circuit into an analog adding circuit 20. For this purpose the inner loop comprises an internal digital to analog converter 30b. The adding circuit 20 has the task of adding up output signals of a filter loop with typically several integrators or resonators 80 as well as the fed back signal of the inner loop 200. The added up signal forms the input signal of a quantizing circuit 40 which generates from the output signal of the adding circuit 20 a signal which has been made discrete or quantized and represents the digital output signal in the form of a specific coding. The quantized signal can in this case accept only specific discrete values.

For a CT-SD modulator circuit, a circuit arrangement, comprising an adding circuit for adding a fed back digital signal to one or more analog signals and also a quantizing circuit which makes discrete or quantizes the added up signal, is thus needed in an inner loop. The quantized output signal of the quantizing circuit in turn forms the basis for the fed back digital signal.

FIG. 4 shows schematically a conventional semi-conductor circuit arrangement for adding a fed back digital signal to several analog signals and quantizing the added up signal in a CT-SD modulator circuit. The addition takes place in the intrinsically faster current mode, i.e. analog voltage signals Vin1, Vin2 are converted into analog current signals by a voltage to current conversion circuit 10 and added to an output current signal of a digital to analog converter circuit 30', to which a digital input signal coded via m individual signals DACin1, . . . , DACinm is supplied. The added up current signal is converted back into voltage signals with the aid of resistors 25 and fed into a sample and hold circuit 50. Quantizing takes place via a quantizing circuit 40' comprising a number of comparator elements 45', the number of comparator elements 45' corresponding to the number of discrete values which the quantized signal can accept.

One of the comparator elements compares its respective input voltage with a respective reference voltage provided by a reference voltage generating circuit 60. For this purpose the comparator element 45' has two differential voltage inputs, i.e. a total of four signal inputs.

Depending on the comparison of the input voltage with the reference voltage, the output signal of each comparator element 45' accepts one of two possible voltage values in each case, so the m output signals OUT1, . . . , OUTm of the comparator elements 45' represent a digital output signal 2 of the quantizing circuit 40' in the form of a coding. The coding is chosen in this case in such a way that the digital output signal of the quantizing circuit 40' is suitable for feeding back via the digital to analog converter circuit 30'.

One problem with the above-explained implementation of adding and quantizing is that active components, e.g. in the form of operational amplifiers, are needed both for the sample and hold circuit and for the reference voltage generating circuit. When the semi-conductor circuit arrangement is used in a high-speed broadband signal transmission system they have to meet high demands in respect of their bandwidth and increase the power consumption of the modulator circuit.

One object of the present invention is therefore to provide a semi-conductor circuit arrangement which enables addition of a fed back digital signal to at least one analog signal and subsequent quantizing of the added up signal with low outlay.

SUMMARY

The semi-conductor circuit arrangement according to the invention comprises an adding circuit, a quantizing circuit with comparator elements and a digital to analog converter circuit, wherein output signals of the quantizing circuit are suitable as input signals of the digital to analog converter circuit.

The addition of at least one analog input signal to a fed back digital signal takes place in current mode. A digital to analog converter circuit is used for this, the output signal of which is a current signal which is added to at least one input current signal of the adding circuit.

The adding circuit comprises a resistor ladder consisting of a first and a second string. The strings of the resistor ladder comprise in each case a series circuit of tapping resistors through which the sum made up of the output current signal of the digital to analog converter circuit and the at least one input current signal of the adding circuit flows. An output signal of the adding circuit forming an input signal of a specific comparator element in each case is formed by a voltage between a tap at a specific tapping resistor of the first string of the resistor ladder and a tap at a specific tapping resistor of the second string of the resistor ladder. The adding circuit and the selection of taps is here configured in such a way that an output signal of one of the comparator elements accepts one of two possible values in each case depending exclusively on the respective input signal provided by the adding circuit.

The adding circuit preferably comprises direct voltage source means which impress a direct current into the strings of the resistor ladder, so a direct voltage which is released at the tapping resistors produces a specific direct voltage at the input of a specific comparator element. The input signal of a specific comparator element is thus composed of the specific direct voltage and a further voltage signal produced by the added up current signals in the strings of the resistor ladder.

The semi-conductor circuit arrangement can furthermore comprise a voltage to current conversion circuit which converts analog voltage signals into analog input current signals of the adding circuit.

A particularly compact and efficient construction of the circuit which, in particular, does not need a sample and hold circuit or a separate module for generating reference voltages, emerges as an advantage of the semi-conductor circuit arrangement according to the invention. This means that the power consumption and the space requirement of the circuit on a semi-conductor chip can be considerably reduced.

The use of the resistor ladder with impressed direct current enables the input signal of each of the comparator elements of the quantizing circuit to be configured in such a way that the output signal of the respective comparator element depends solely on the sign of the input signal. This makes implementation of the comparator elements in terms of switching technology considerably easier and the space requirement of the semi-conductor circuit arrangement on the semi-conductor chip is thus further reduced.

The invention is particularly suitable for use in a CT-SD modulator circuit.

BRIEF DESCRIPTION OF THE DRAWINGS

The present invention is explained below with reference to the attached drawings using a preferred embodiment example.

DESCRIPTION

Figure 1:
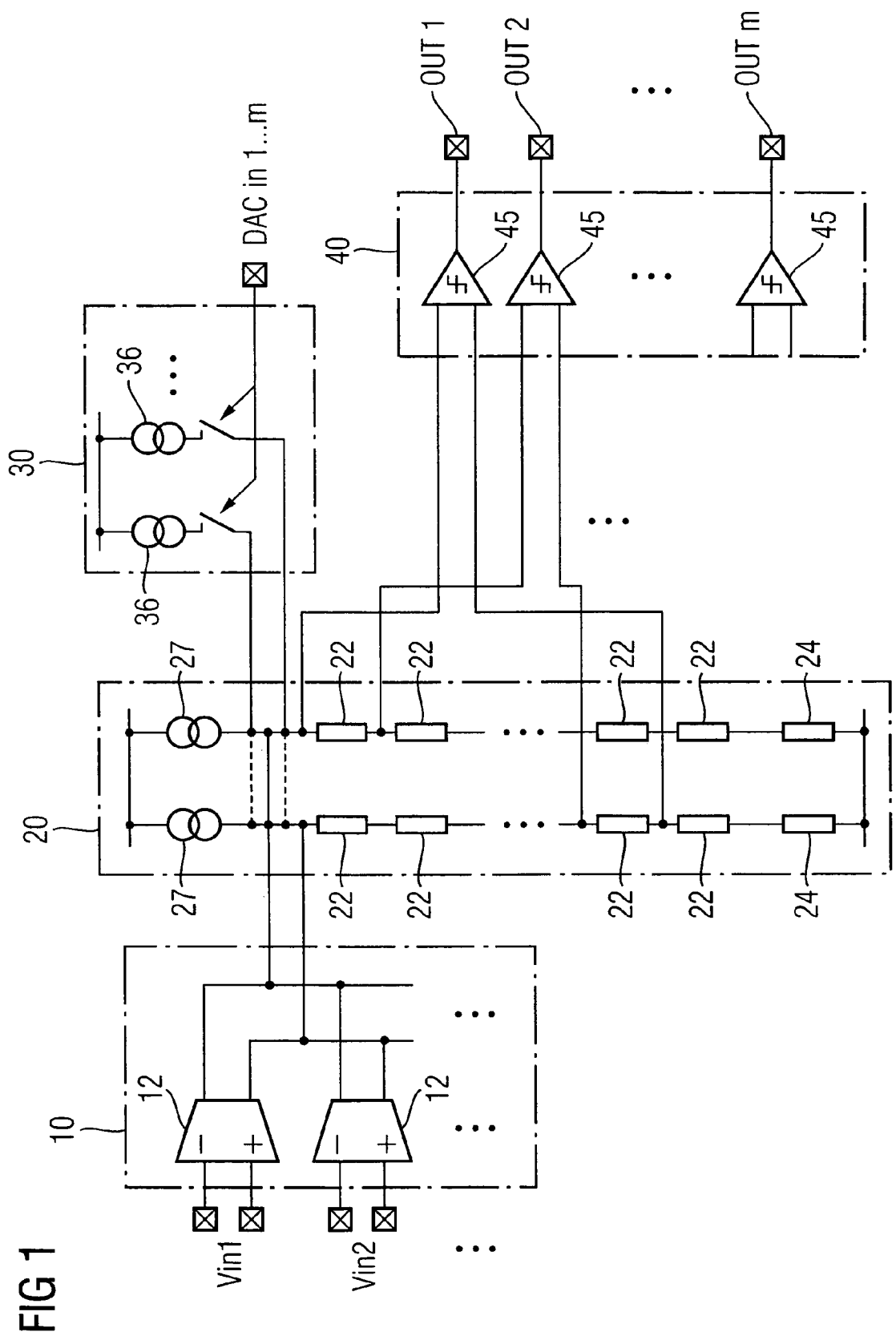
FIG. 1 shows schematically an embodiment example of a semi-conductor circuit arrangement according to the invention for use in an inner loop of a CT-SD modulator circuit.

FIG. 1 shows schematically the construction of a semi-conductor circuit arrangement according to an embodiment example of the present invention. The semi-conductor circuit arrangement is configured for use in the inner loop of a CT-SD modulator circuit and comprises an adding circuit 20, a quantizing circuit 40, a digital to analog conversion circuit 30 and a voltage to current conversion circuit 10.

The digital to analog conversion circuit 30 converts a digital input signal DACin1, . . . , DACinm into a current signal which is supplied to the adding circuit 20. The digital to analog conversion circuit 30 is configured as a parallel, current-based digital to analog conversion circuit consisting of a number m of unit cells 36. Each unit cell 36 comprises a current source means for providing a specific direct current, which is conducted, depending on the digital input signal, either to a first, positive output of a differential current output of the digital to analog conversion circuit 30 or to a second, negative output of the differential current output.

The voltage to current conversion circuit 10 converts input voltage signals Vin1, Vin2 into current signals. For this purpose the voltage to current conversion circuit 10 comprises voltage to current conversion means 12, which generate output current signals depending on the input voltage signals Vin1, Vin2. The output current signals of the voltage to current conversion means 12 are added in the adding circuit 20 to the current signal provided by the digital to analog conversion circuit 30. One current output of each voltage to current conversion means 12 is configured differentially and has a first, positive current output and a second, negative current output.

The quantizing circuit 40 comprises a number m of comparator elements 45, this number corresponding to the number of quantizing steps of the digital output signal of the quantizing circuit 40. The number m of comparator elements 45 is given during quantizing with n bit accuracy by $$m=2^n-1$$

For a 4-bit quantizing circuit the number of comparator elements 45 thus comes to m=15. Depending on its input voltage signal, the output voltage signal Out1, . . . , Outm of each comparator element 45 accepts one of two possible voltage values in each case, so the output voltage signals Out1, . . . , Outm of the comparator elements 45 form a digital coding of the added up input signals of the adding circuit 20. The comparator elements 45 are in particular configured in such a way that their output signal Out1, . . . , Outm accepts one of two possible voltage values depending solely on the sign of their input signal.

The adding circuit 20, as can be seen in FIG. 1, comprises a resistor ladder into which the input current signals to be added up are fed. The resistor ladder is made up of a first and a second string, each of which comprises a series circuit of a number m of tapping resistors 22 and a terminating resistor 24. Specifically, the first string of the resistor ladder serves to receive a first, positive part of a differential input current signal and the second string to receive a second, negative part of a differential input current signal. Furthermore, in each string a current source means 27 is provided for impressing a direct current into the respective string of the resistor ladder.

The adding circuit 20 comprises taps on or in front of each of the tapping resistors 22. An ith output signal of the adding circuit 20 is formed by a voltage which is released between the tap in front of the (m−i+1)th tapping resistor 22 of the first string and the tap of the ith tapping resistor 22 of the second string. For an ith output voltage $V_{out,i}$ of the adding circuit 20 the following applies $$V_{out,i} = [(m+1)R_1 + 2R_d]\left(\sum_k I_{in,k}\right) + (m-2i+1)R_1\left(I_{DC} + \frac{m}{2}I_{DAC}\right),$$

wherein $R_1$ designates the identical resistance of the tapping resistors 22, $R_d$ the resistance of the terminating resistors 24, $I_{in,k}$ a kth input current signal of the adding circuit 20, $I_{DC}$ the direct current impressed into the strings of the resistor ladder and $I_{DAC}$ the current of the unit cell 36 of the digital to analog conversion circuit 30. The input current signals here comprise both the current signals provided by the voltage to current conversion circuit 10 and the output current signal of the digital to analog conversion circuit 30. The digital to analog conversion circuit 30 furthermore makes a contribution $$mI_{DAC}/2,$$

which is added to the direct current impressed by the current source means 27.

The input signal of each comparator element 45 is thus formed by the sum of two contributions $$V_{A,i} = [(m+1)R_1 + 2R_D]\left(\sum_k I_{in,k}\right),$$

$$V_{B,i} = (m-2i+1)R_1\left(I_{DC} + \frac{m}{2}I_{DAC}\right)$$

The first contribution is identical for each of the comparators 45 and contains the sum of the input current signals, so it comprises the function of the signal addition. The second contribution on the other hand does not depend on the input current signals and contains a direct voltage which accepts a different value for each of the comparators 45. For example, in a 4-bit quantization, i.e. where m=15, $$V_{B,1} = 7V_{ref},$$

$$V_{B,2} = 6V_{ref},$$

...

$$V_{B,8} = 0,$$

...

$$V_{B,14} = -6V_{ref}$$

$$V_{B,15} = -7V_{ref},$$

with $$V_{ref} = 2R_1\left(I_{DC} + \frac{15}{2}I_{DAC}\right).$$

The second contribution of the input voltage signals of the comparator elements 45 thus provides a different direct voltage for each of the comparator elements 45, which takes on the function of a reference voltage. Thus each comparator element 45 effectively compares the first contribution to an input voltage signal with a specific reference voltage by checking the sign of its input signal.

As a reference voltage is also generated for $I_{DC}=0$, implementation of the circuit is also possible without special current source means 27, though the additional current source means 27 enable improved tuning of the circuit.

The output signals Out1, ... , Outm of the comparator elements 45 represent a digital coding of the totalled input current signals of the adding circuit 20 and are configured in such a way that they are suitable as digital input signals of the digital to analog conversion circuit 30, so feeding back the digital output signal of the quantizing circuit 40 into the adding circuit 20 is enabled. In particular, in this case the number m of the unit cells 36 of the digital to analog conversion circuit 30 corresponds to the number m of quantizing steps of the quantizing circuit 40, i.e. to the number of comparator elements 45 and also the number of tapping resistors 22 in the adding circuit 20.

As the current of a unit cell 36 is fed either into the positive or the negative string of the resistor ladder and as an uneven number m of unit cells 36 is used, the coding of the current-based parallel digital to analog conversion circuit 30 is chosen in such a way that a zero signal cannot be represented. This means that a signal fed back via the digital to analog conversion circuit 30 is always different from zero.

Figure 2:
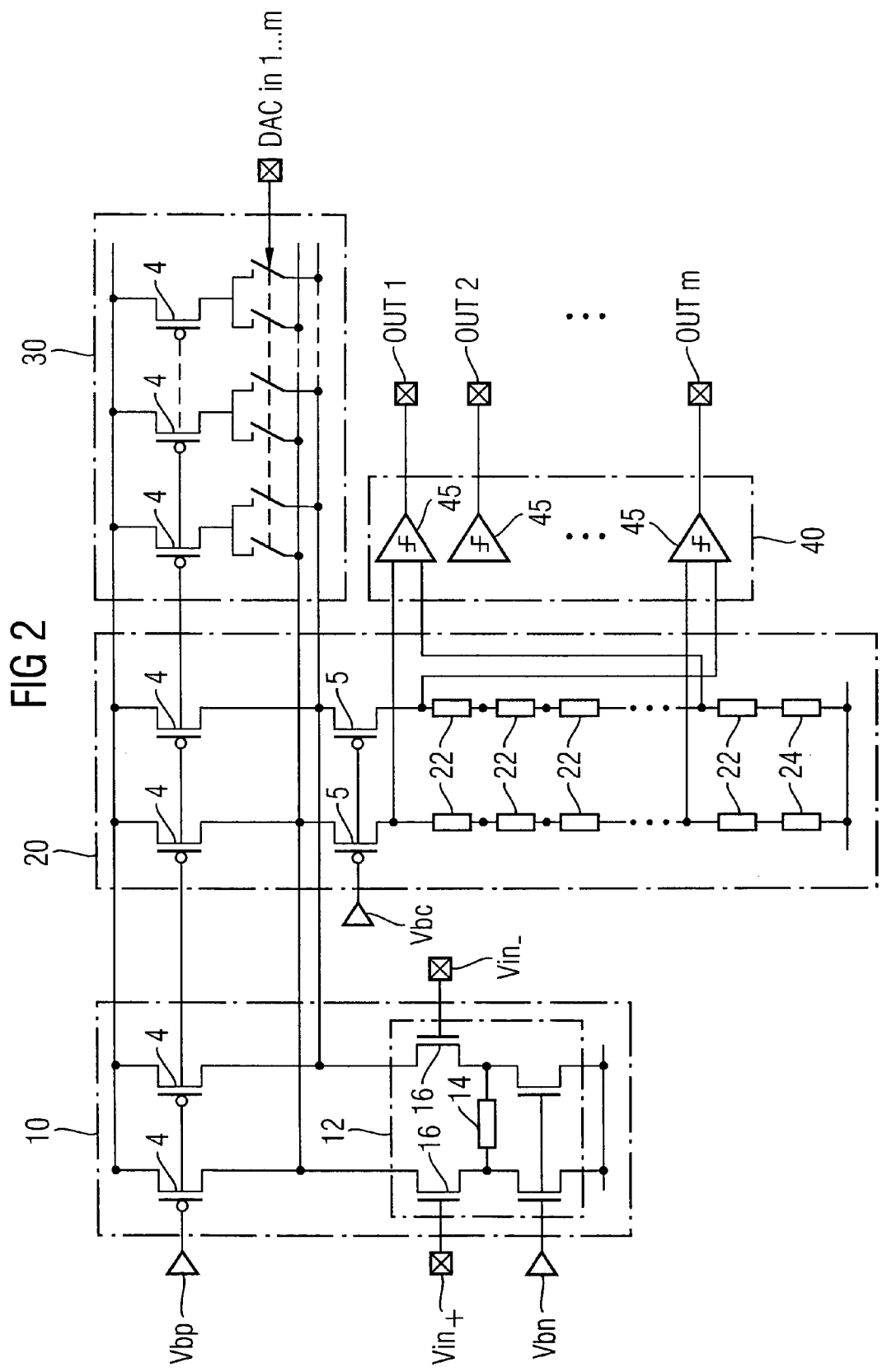
FIG. 2 shows a possible circuit construction of a semi-conductor circuit arrangement according to the embodiment example of the present invention.
Figure 3:
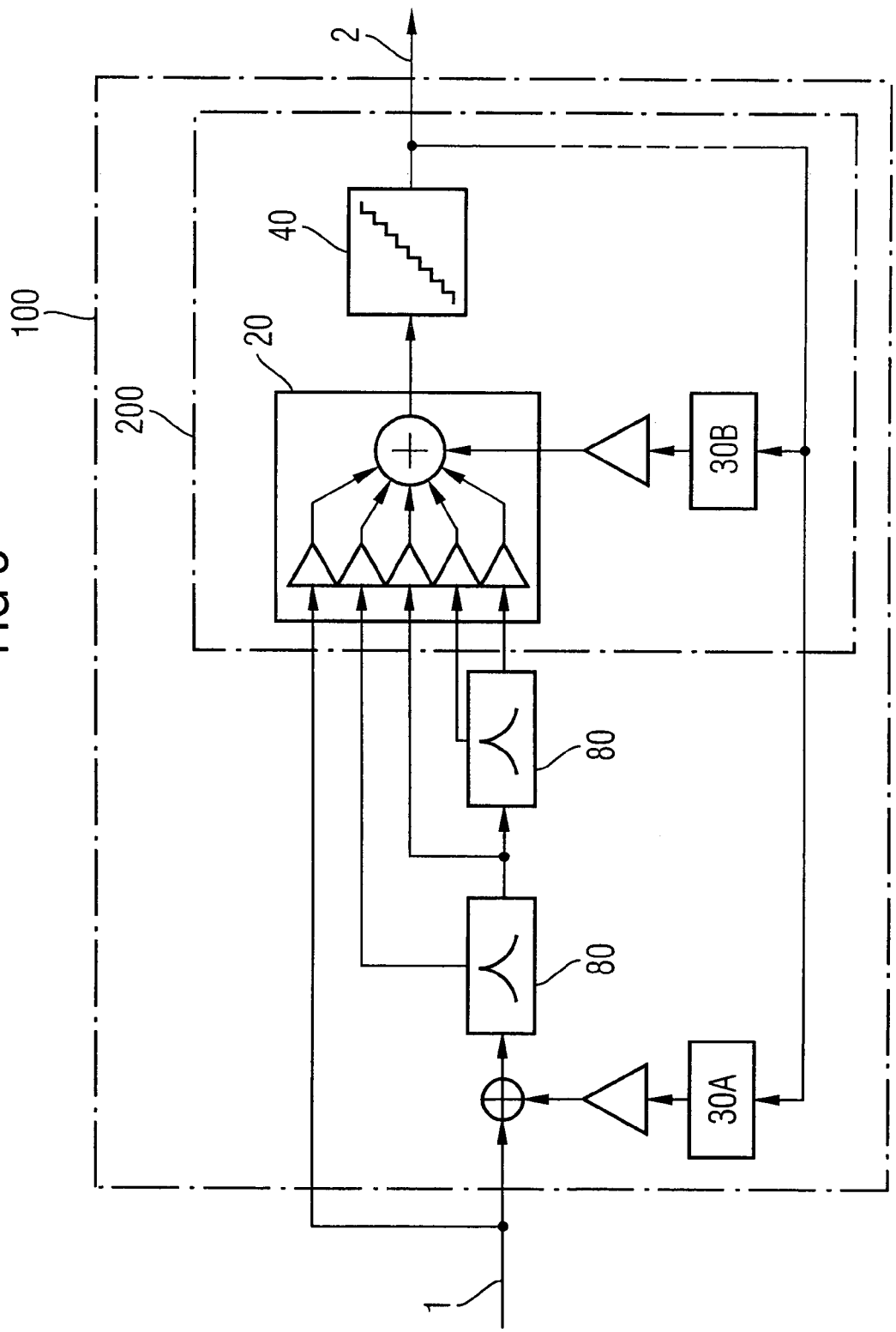
FIG. 3 shows schematically a 4-bit CT-SD modulator circuit of the fourth order.
Figure 4:
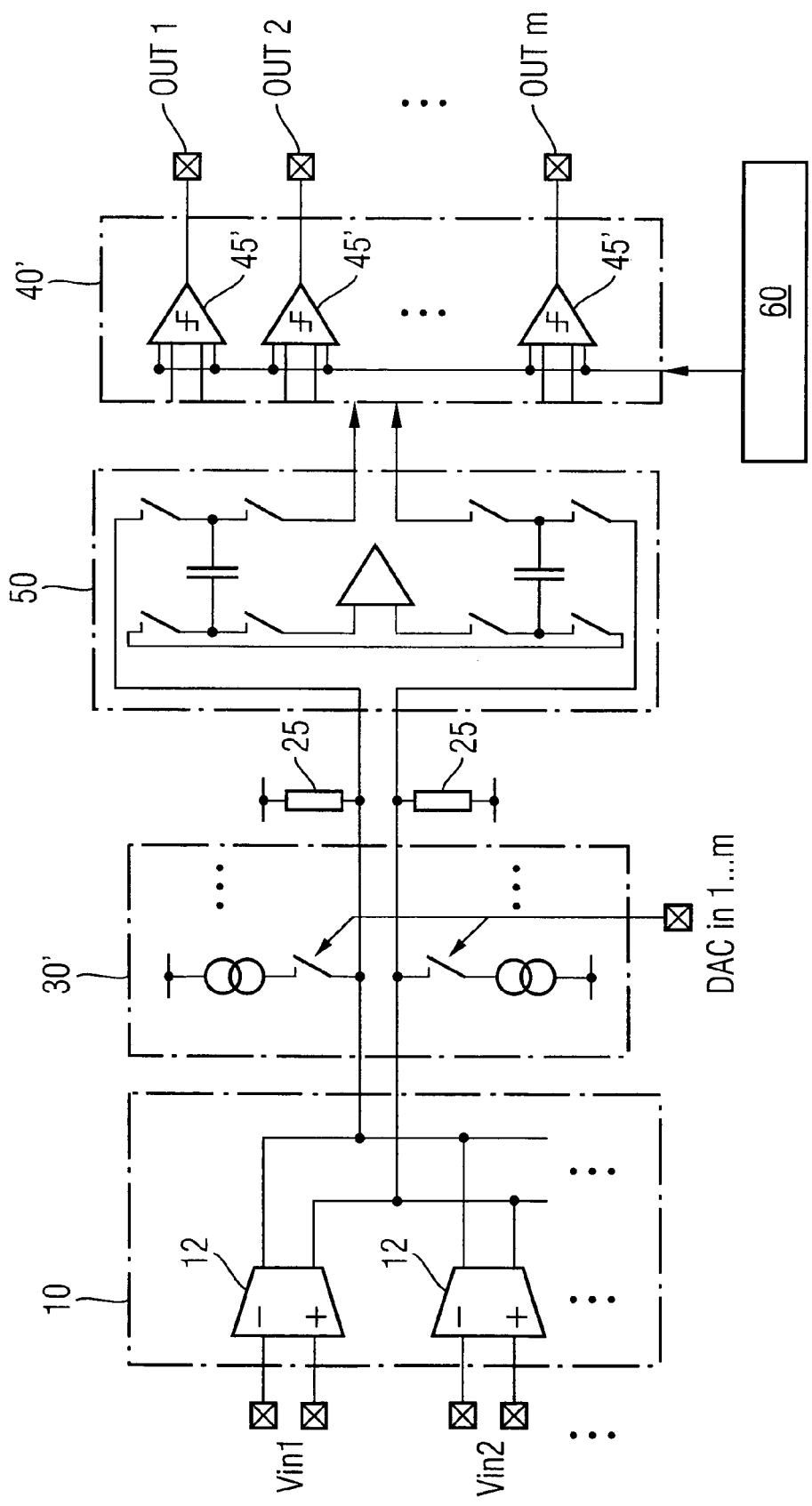
FIG. 4 shows schematically a conventional semi-conductor circuit arrangement for adding and quantizing current signals and also for digital to analog conversion of a fed back signal for the inner loop of a CT-SD modulator circuit.

As emerges from the circuit construction shown in FIG. 2, the current to voltage conversion means 12, only one of which is illustrated in FIG. 2, are formed by a transconductance circuit arrangement. The transconductance circuit arrangement is differentially configured and comprises for the positive and the negative part of the differential signal as transconductance element in each case a field effect transistor 16, to the gate contact of which the respective differential input voltage signal Vin+, Vin− is applied, in order thereby to control the respective output current signal. A current negative feedback resistor 14 connects the two strings of the differential transconductance circuit arrangement. The transconductance circuit arrangement additionally comprises further field effect transistors, the gate contacts of which are connected to a bias voltage input Vbn, so a forward coupling coefficient or insertion coefficient, via which insertion of the signals into the adding circuit 20 can be influenced, can be controlled via the applied bias voltage.

As shown in FIG. 2, in the voltage to current conversion circuit 10, the adding circuit 20 and the digital to analog conversion circuit 30 transistor elements 4 are provided as current source means which serve to provide a direct current for the voltage to current conversion means 12, for the unit cells 36 of the digital to analog conversion circuit 30 and for the strings of the resistor ladder. The direct current can in this case be set jointly for all the current source means via a further bias voltage input Vbp. This leads to improved matching among the individual circuit components.

As FIG. 2 shows, between an insertion point of the input current signals and the series circuit of tapping resistors 22, to form a cascade structure, the adding circuit 20 comprises in each string of the resistor ladder in each case a further transistor element 5, the gate contact of which is connected to another further bias voltage input Vbc, so via a bias voltage applied thereto the voltage can be kept constant at the insertion points of the input current signals. This gives improved linearity of the voltage to current conversion owing to the transconductance circuit arrangements.

The above-described semi-conductor circuit arrangement is particularly suitable for use in the inner loop of a CT-SD modulator, but it is not restricted to this. Owing to its compact and efficient construction it guarantees a small space requirement and low power consumption.

What is claimed is:

1. A semi-conductor circuit comprising:
  a digital to analog conversion circuit;
  an adding circuit operable to add an output current signal of the digital to analog conversion circuit as an input current signal to at least one further input current signal, the adding circuit further operable to provide a plurality of adding circuit output signals; and
  a quantizing circuit including a plurality of comparator elements, each of the plurality of comparator elements operable to receive at least one input signal and provide a comparator element output signal;
  wherein the at least one input signal of each of the plurality of comparator elements is derived from one of the plurality of adding circuit output signals and wherein the comparator element output signals are provided as digital input signals to the digital to analog conversion circuit; and
  wherein the adding circuit comprises a resistor ladder including a first string and a second string, the first string and the second string each comprising a series circuit of a plurality of tapping resistors, wherein each of the plurality of adding circuit output signals is formed by a voltage between a tap at one of the plurality of tapping resistors of the first string and a tap one of the plurality of tapping resistors of the second string.

2. The semi-conductor circuit of claim 1 wherein m is the number of tapping resistors in both the first string and second string of the resistor ladder, and m is also the number of comparator elements in the quantizing circuit, and wherein the input signal of the ith comparator element of the quantizing circuit is derived from the ith adding circuit output signal by the voltage between a tap at the ith tapping resistor of the first string and a tap at the (m−i+1)th tapping resistor of the second string.

3. The semi-conductor circuit of claim 1 wherein the digital to analog conversion circuit comprises a parallel arrangement of a plurality of unit cells, wherein the number of unit cells corresponds to the number of comparator elements of the quantizing circuit and wherein each unit cell feeds a current either into the first string of the resistor ladder or into the second string of the resistor ladder.

4. The semi-conductor circuit arrangement of claim 3 wherein a coding of the digital to analog conversion circuit is configured in such a way that a zero signal cannot be represented.

5. The semi-conductor circuit arrangement of claim 1 further comprising a current source for impressing a direct current into each of the first string and second string of the resistor ladder, wherein the input current signals of the adding circuit are superimposed over the direct current.

6. The semi-conductor circuit of claim 1 wherein the series circuit of a plurality of tapping resistors in each of the first string and the second string of the resistor ladder include terminating resistors.

7. The semi-conductor circuit of claim 1 further comprising a voltage to current conversion circuit operable to convert at least one input voltage signal into an output current signal of the voltage to current conversion circuit from which the at least one further input current signal of the adding circuit is derived.

8. The semi-conductor circuit of claim 7 wherein the at least one voltage to current conversion circuit includes a transconductance element comprising field effect transistors.

9. The semi-conductor circuit arrangement of claim 7 wherein the at least one voltage to current conversion circuit includes a differential transconductance circuit arrangement comprising field effect transistors and a current negative feedback resistor, wherein the differential transconductance circuit arrangement has a differential voltage input and a differential current output, a first output of the differential current output being connected to the first string of the resistor ladder and a second output of the differential current output being connected to the second string of the resistor ladder.

10. The semi-conductor circuit of claim 7 further comprising a bias voltage input for controlling a forward coupling coefficient of the at least one voltage to current conversion circuit via the conductance of at least one field effect transistor.

11. The semi-conductor circuit of claim 7 further comprising a bias voltage input for joint control of current sources in the voltage to current conversion circuit, in the adding circuit and in the digital to analog conversion circuit.

12. The semi-conductor circuit arrangement of claim 1 further comprising a bias voltage input for stabilizing the voltage at a signal input of the adding circuit allocated to the input current signal and the at least one further input current signal.

13. The semi-conductor circuit arrangement of claim 1 wherein the semi-conductor circuit arrangement is configured for use in a continuous time sigma delta modulator circuit.

14. The semi-conductor circuit of claim 1 wherein the semiconductor circuit is provided as part of a loop of a continuous time sigma delta modulator circuit.

15. A continuous time sigma delta modulator circuit comprising:
   a digital to analog conversion circuit operable to receive digital input signals and provide at least one DAC output current signal;
   an adding circuit operable to add the at least one DAC output current sensor to at least one further input current signal, the adding circuit comprising a resistor ladder including a first string and a second string, the first string including a series of a first plurality of tapping resistors and a first plurality of taps, and the second string including a series of a second plurality of tapping resistors and a second series of taps, wherein a plurality of adding circuit output signals are formed by voltages provided between each of the first plurality of taps and a corresponding tap from the second plurality of taps; and
   a quantizing circuit including a plurality of comparator elements, each of the plurality of comparator elements operable to receive at least one input signal and provide a comparator element output signal, wherein the at least one input signal of each of the plurality of comparator elements is derived from one of the plurality of adding circuit output signals and wherein the comparator element output signals are provided as the digital input signals to the digital to analog conversion circuit.

16. The circuit of claim 15 wherein the digital to analog conversion circuit comprises a parallel arrangement of a plurality of unit cells, wherein the number of unit cells corresponds to the number of comparator elements of the quantizing circuit, and wherein each unit cell feeds electrical current either into the first string of the resistor ladder or into the second string of the resistor ladder.

17. The circuit of claim 15 wherein m is the number of tapping resistors in both the first string and second string of the resistor ladder, and m is also the number of comparator elements in the quantizing circuit, and wherein the input signal of the ith comparator element of the quantizing circuit is derived from the ith adding circuit output signal by the voltage between a tap at the ith tapping resistor of the first string and a tap at the (m−i+1)th tapping resistor of the second string.

18. The circuit of claim 15 further comprising a voltage to current conversion circuit operable to convert at least one input voltage signal into an output current signal of the voltage to current conversion circuit from which the at least one further input current signal of the adding circuit is derived.

19. The circuit of claim 15 further comprising a current source for impressing a direct current into each of the first string and second string of the resistor ladder, wherein the input current signals of the adding circuit are superimposed over the direct current.

20. A continuous time sigma delta modulator circuit, wherein a loop of the continuous time sigma delta modulator circuit comprises the semi-conductor circuit of claim 1.

* * * * *